(12) United States Patent
Kumar et al.

(10) Patent No.: US 10,084,485 B2
(45) Date of Patent: Sep. 25, 2018

(54) SOFT DECODER PARAMETER OPTIMIZATION FOR PRODUCT CODES

(71) Applicant: SK Hynix Inc., Gyeonggi-do (KR)

(72) Inventors: Naveen Kumar, San Jose, CA (US); Aman Bhatia, San Jose, CA (US); Yi-Min Lin, San Jose, CA (US)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 15/431,554

(22) Filed: Feb. 13, 2017

(65) Prior Publication Data

US 2017/0279465 A1 Sep. 28, 2017

Related U.S. Application Data

(60) Provisional application No. 62/312,248, filed on Mar. 23, 2016, provisional application No. 62/373,937, filed on Aug. 11, 2016.

(51) Int. Cl.
| | |
|---|---|
| *H03M 13/00* | (2006.01) |
| *H03M 13/29* | (2006.01) |
| *H03M 13/15* | (2006.01) |
| *H03M 13/37* | (2006.01) |
| *H03M 13/45* | (2006.01) |
| *H03M 13/25* | (2006.01) |

(52) U.S. Cl.
CPC ..... *H03M 13/2957* (2013.01); *H03M 13/152* (2013.01); *H03M 13/256* (2013.01); *H03M 13/2909* (2013.01); *H03M 13/3707* (2013.01); *H03M 13/451* (2013.01)

(58) Field of Classification Search
CPC .......... H03M 13/2957; H03M 13/256; H03M 13/2906; H03M 13/3707
See application file for complete search history.

(56) References Cited

U.S. PATENT DOCUMENTS

| | | | |
|---|---|---|---|
| 6,966,024 B2 * | 11/2005 | Park | H03M 13/45 714/774 |
| 7,039,846 B2 | 5/2006 | Hewitt et al. | |
| 7,092,457 B1 * | 8/2006 | Chugg | H04L 1/005 375/324 |

(Continued)

OTHER PUBLICATIONS

Simon A. Hirst "Fast Chase Algorithm With an Application in Turbo Decoding", IEEE Transactions on Communications, vol. 49, No. 10, Oct. 2001, 7 pages.

(Continued)

*Primary Examiner* — Esaw T Abraham
(74) *Attorney, Agent, or Firm* — Kilpatrick Townsend & Stockton LLP

(57) ABSTRACT

In one embodiment, an apparatus for decoding is disclosed. The apparatus includes a memory and at least one processor coupled to the memory. The at least one processor is configured to obtain one or more parameters corresponding to a system, determine a plurality of settings corresponding to an adaptive soft decoding procedure for decoding a product code, wherein the plurality of settings are determined based on the one or more parameters using a trellis, and determine a decoded codeword by performing the adaptive soft decoding procedure on the received codeword, wherein the adaptive soft decoder utilizes the determined plurality of settings.

20 Claims, 9 Drawing Sheets

(56) References Cited

U.S. PATENT DOCUMENTS

| | | | | |
|---|---|---|---|---|
| 7,260,762 | B2* | 8/2007 | Desai | H03M 13/2963 714/755 |
| 7,310,767 | B2* | 12/2007 | Desai | H03M 13/2909 714/780 |
| 7,373,585 | B2 | 5/2008 | Yedidia et al. | |
| 7,510,767 | B2* | 3/2009 | Hatsuda | C08F 290/06 428/411.1 |
| 7,515,601 | B2* | 4/2009 | Lai | H04L 1/005 370/442 |
| 7,886,752 | B2 | 2/2011 | Jerg | |
| 7,986,752 | B2* | 7/2011 | Nikopour-Deilami | H04L 1/005 375/341 |
| 8,352,840 | B2* | 1/2013 | Crozier | H03M 13/296 714/780 |
| 8,473,780 | B2 | 6/2013 | Shalvi | |
| 8,599,959 | B2 | 12/2013 | Krachkovsky et al. | |
| 8,850,296 | B2 | 9/2014 | Weingarten et al. | |
| 8,850,298 | B2 | 9/2014 | Wu | |
| 8,943,384 | B2* | 1/2015 | Sridhara | G06F 11/1048 714/755 |
| 9,135,155 | B2* | 9/2015 | Sharon | G06F 11/1012 |
| 9,231,623 | B1 | 1/2016 | Kumar et al. | |
| 9,337,873 | B2 | 5/2016 | Marrow et al. | |
| 9,454,428 | B2* | 9/2016 | Cai | H03M 13/458 |
| 9,645,763 | B2* | 5/2017 | Sankaranarayanan | G06F 3/0653 |
| 2003/0093740 | A1 | 5/2003 | Stojanovic | |
| 2015/0333776 | A1 | 11/2015 | Bolotov et al. | |
| 2016/0164543 | A1 | 6/2016 | Kumar | |
| 2017/0279466 | A1 | 9/2017 | Lin | |
| 2017/0279467 | A1 | 9/2017 | Bhatia | |

OTHER PUBLICATIONS

R. Pyndiah "Near-Optimum Decoding of Product Codes: Block Turbo Codes",IEEE Transactions on Communications, vol. 46, No. 8, Aug. 1998, 8 pages.

Phong S. Nguyen "On Multiple Decoding Attempts for Reed-Solomon Codes: A Rate-Distortion Approach", Nov. 9, 2010, 55 pages.

Thierry Goubier "Fine Grain Parallel Decoding of Turbo Product Codes: Algorithm and Architecture", Oct. 2008, 6 pages.

Non-Final Office Action for U.S. Appl. No. 15/432,255 dated Dec. 27, 2017, 11 pages.

Non-Final Office Action for U.S. Appl. No. 15/433,857 dated Dec. 27, 2017, 11 pages.

Gabi Sarkis "Increasing the Speed of Polar List Decoders", Jun. 10, 2014, 6 pages.

Alexei Ashikhmin et al. "Simple MAP decoding of first-order Reed-Muller and Hamming codes," to A. Ashikhmin, S. Litsyn, published in IEEE Trans. Inform Theory, vol. 50, No. 8, pp. 1812-1818, Aug. 2004, 7 pages.

Fijo Therattil et al. "A Low-complexity Soft-decision Decoder for Extended BCH and RS-like codes," published in Conference: Information Theory, 2005. ISIT 2005. Proceedings. International Symposium, Oct. 2005, 5 pages.

Trushita Chaware et al "Performance of Turbo Product Code in Wimax," published in IJACSA Special Issue on Selected Papers from International Conference & Workshop on Advance Computing, 2013, 5 pages.

Ruiyuan Hu et al "Quantization and Quantization Sensitivity of Soft-Output Product Codes for Fast-Speed Applications," published in Advances in Wired and Wireless Communication, 2004 IEEE/ Sarnoff Symposium on Apr. 26-27, 2007, 4 pages.

* cited by examiner

SOFT DECODER PARAMETER OPTIMIZATION FOR PRODUCT CODES

CROSS-REFERENCE TO RELATED APPLICATIONS

The present application claims priority to Provisional Application No. 62/312,248 entitled "Performance Optimization In Soft Decoding For Turbo Product Codes," filed Mar. 23, 2016, and Provisional Application No. 62/373,937 entitled "Soft Decoder Parameters Optimization For Generalized Product Codes," filed Aug. 11, 2016, both of which are assigned to the assignee hereof and expressly incorporated by reference herein in their entirety.

TECHNICAL FIELD

The present disclosure relates generally to error correcting codes, and in particular, to an efficient soft decision decoder for decoding the error correcting codes.

BACKGROUND

For data storage applications, it is imperative to use error correcting codes (ECC) to provide data integrity. Low density parity check codes (LDPC) and Bose-Chaudhuri-Hocquenghem (BCH) codes are most commonly used for ECC in data storage applications. Use of product codes (e.g., turbo product codes, generalized product codes, and the like) for storage applications has recently been proposed. Product codes have several advantages over LDPC and BCH codes in terms of hardware complexity. However, there is a need in the art to improve soft decoding performance of these codes.

SUMMARY

Embodiments for decoding a product code are described. In an example, an apparatus includes, in part, a memory and at least one processor coupled to the memory. The at least one processor is configured to obtain one or more parameters corresponding to a system, and determine a plurality of settings corresponding to an adaptive soft decoding procedure for decoding a product code. The plurality of settings are determined based on the one or more parameters using a trellis. The processor is further configured to determine a decoded codeword by performing the adaptive soft decoding procedure on a received codeword, wherein the adaptive soft decoder utilizes the determined plurality of settings.

In one embodiment, the adaptive soft decoder comprises a Chase (L,S) decoder, in which L represents a maximum number of least reliable bits, and S represents a maximum number of allowed bit flips in each flipped bit sequence.

In one embodiment, the at least one processor is further configured to decode at least one of constituent codewords in the received codeword by performing the adaptive soft decoding procedure using a first set of decoder settings for a first set of decoding iterations to generate a first codeword, wherein the plurality of setting comprises a first set of decoder settings and a second set of decoder settings, and performing the soft decoding procedure on the first codeword using the second set of decoder settings for a second set of decoding iterations to generate a second. The at least one of the values in the first set of decoder settings is different from its corresponding value in the second set of decoder settings. The processor is further configured to update the at least one constituent codeword based on the second codeword.

In one embodiment, the trellis comprises a plurality of states and a plurality of stages, wherein a first state corresponds to a first set of decoder settings and a second state corresponds to a second set of decoder settings, wherein at least one of the values in the first set of decoder settings is different from its corresponding value in the second set of decoder settings.

In one embodiment, the at least one processor is further configured to generate a plurality of path metrics corresponding to a plurality of state transitions in the trellis, and determine the plurality of settings corresponding to the adaptive decoder by selecting the plurality of settings corresponding to a maximum path metric.

In one embodiment, the at least one processor is further configured to determine a transition metric corresponding to transition from a first state in the trellis to a second state in the trellis based on the number of corrected errors by transitioning from the first state to the second state, wherein the first state corresponds to a first set of decoder settings and the second state corresponds to a second set of decoder settings.

In one embodiment, the at least one processor is further configured to determine a transition metric corresponding to transition from a first state in the trellis to a second state in the trellis based on the number failed constituent codewords at a soft decoding iteration corresponding to the second state, wherein the first state corresponds to a first set of decoder settings and the second state corresponds to a second set of decoder settings.

In one embodiment, the product code is a turbo product code. In another embodiment, the product code is a generalized product code.

In an example, a method includes obtaining, by a computing device, one or more parameters corresponding to a system. The method also includes determining, by the computing device, a plurality of settings corresponding to an adaptive soft decoding procedure for decoding the product code. The plurality of settings are determined based on the one or more parameters using a trellis. The method also includes determining, by the computing device, a decoded codeword by performing the adaptive soft decoding procedure on a received codeword. The adaptive soft decoding procedure utilizes the determined plurality of settings.

In an example, a non-transitory computer-readable storage medium includes instructions that, upon execution by a processor of a computing device, configure the computing device to perform operations. The operations include obtaining or more parameters corresponding to a system. The operations also include determining a plurality of settings corresponding to an adaptive soft decoding procedure for decoding the product code. The plurality of settings are determined based on the one or more parameters using a trellis. The operations also include determining a decoded codeword by performing the adaptive soft decoding procedure on a received codeword. The adaptive soft decoding procedure utilizes the determined plurality of settings.

BRIEF DESCRIPTION OF THE DRAWINGS

An understanding of the nature and advantages of various embodiments may be realized by reference to the following figures. In the appended figures, similar components or features may have the same reference label. Further, various components of the same type may be distinguished by following the reference label by a dash and a second label that distinguishes among the similar components. If only the first reference label is used in the specification, the description is applicable to any one of the similar components having the same first reference label irrespective of the second reference label.

DETAILED DESCRIPTION

Figure 1:
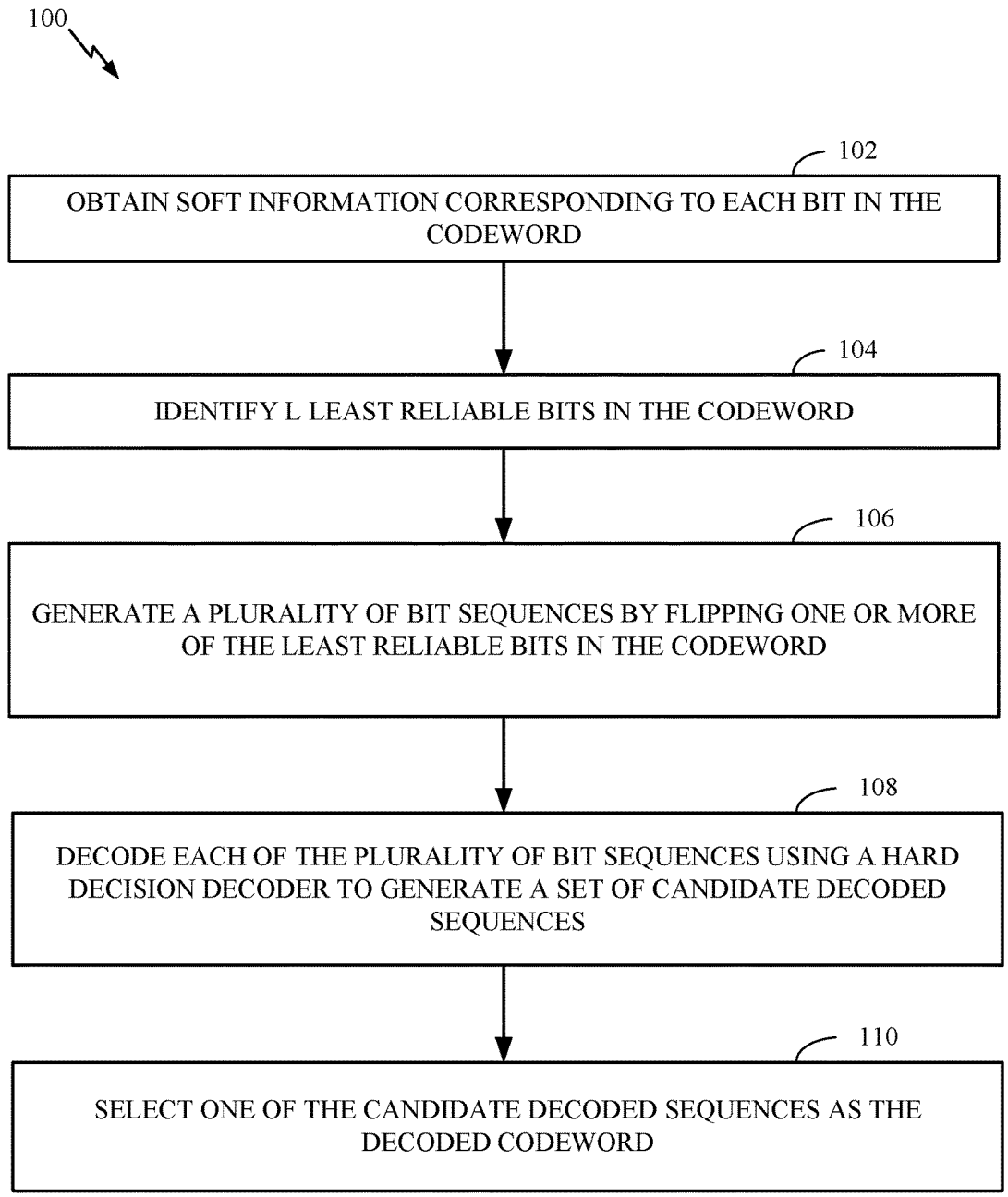
FIG. 1 illustrates a flow diagram describing an example process of decoding a codeword using Chase (L, S) decoding algorithm, in accordance with certain embodiments of the present disclosure.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

The term "error correcting code (ECC)" is used herein to refer to a codeword that is generated by a process of adding redundant data, or parity data, to a message, such that it can be recovered by a receiver even when a number of errors are introduced, either during the process of transmission, or storage. In general, ECC decoding can correct one or more errors up to the capability of the code being used. Error-correcting codes are frequently used in communications, as well as for reliable storage in storage systems such as CDs, DVDs, hard disks, and random access memories (RAMs), flash memories, and the like. Error correcting codes may include product codes (e.g., turbo product codes (TPC), generalized product codes (GPC)), low density parity check codes (LDPC), Bose-Chaudhuri-Hocquenghem (BCH) codes, Reed Solomon codes, and the like.

Turbo product codes are a promising candidate for correcting errors in storage applications. Turbo product codes may include two or more dimensions, each of which corresponding to a class of error correcting codes, such as BCH codes, Reed Solomon codes, or the like. The ECC code corresponding to each dimension of the TPC code is referred to herein as a constituent code. In one example, a multi-dimensional TPC codeword may include one or more error correcting codewords (e.g., BCH codewords) corresponding to each of its dimensions. TPC codes may be decoded by performing an iterative decoding procedure on the constituent codewords in different dimensions. As an example, for decoding a TPC code with BCH constituent codes, the TPC decoder performs BCH decoding on one or more codewords in each dimension of the TPC code. The TPC decoder may iteratively continue the decoding process until either a correct codeword is found or decoding failure is declared.

The term "hard decision" is used herein to refer to a bit that comprises a "0" or a "1" value, and is associated with a particular location within a codeword. A "hard decision" may also be referred to as a "hard output" or "hard information." In some embodiments, the reliability of each hard decision may be known. The "reliability" of a hard decision refers to a probability (e.g., a value from "0" through "1") that the corresponding hard decision is correct. A "reliability" may also be referred to as "soft information" or a "soft output." In a NAND channel, a reliability for each bit may be obtained, for example, by multiple read operations from the NAND memory using different thresholds. In general, if the hard decision decoding of a codeword fails, soft information can be used to decode the failed codeword using soft decoding techniques, such as Chase decoding. Alternatively, soft decoding may be performed on a received codeword from the beginning of the decoding if a better decoding performance is desired.

The constituent codes in each dimension of the TPC decoder may be decoded using a number of decoding algorithms, depending on the type of the code that is used in the constituent code, and whether or not reliability information corresponding to each bit is available. For example, if reliability information is not available, hard decision decoding may be used. Alternatively, if reliability information is available, soft decoding procedures such as Chase decoding (and its variations) may be used to decode a codeword. Chase decoding is a type of list decoding algorithm in which the decoder outputs a list of one or more codewords (including the correct codeword) as the final result of the decoding. For example, in Chase(L) decoding algorithm, soft information is used to identify L least reliable bits in a codeword. The identified least reliable bits are utilized to form a set of error patterns (e.g., all possible error patterns associated with the least reliable bits being in error). These possible error patterns are utilized to flip one or more bits in the received hard decision constituent codeword. A list of successful codewords may then be formed after decoding the flipped constituent codewords. A maximum likelihood metric may then be generated to select a codeword that has the minimum Euclidean distance from the received soft decision constituent codeword as the final decoded codeword. It should be noted that increasing number of the selected least reliable bits increases performance of the decoding. However, decoder complexity increases exponentially with increasing the number of selected least reliable bits.

In a co-pending application, Chase (L,S) decoding is described for decoding constituent codes of a product code using soft information (e.g., from the NAND memory). Certain embodiments disclose an adaptive soft decoder, in which one or more parameters of the soft decoder are adjusted for each iteration of the decoding. In one embodiment, parameters of Chase (L,S) decoding algorithm can be adapted after each one or more iterations of the decoding while iteratively decoding the codeword. For example, in a TPC code with BCH constituent codes, a first set of one or more decoding iterations may be performed using Chase ($L_1, S_1$) and a second set of one or more decoding iterations may be performed using Chase ($L_2, S_2$). As an example, the first five decoding iterations may be performed using Chase (8, 6) and another four decoding iterations may be performed using Chase (6, 4). In another embodiment, the first decoding iteration is performed using a Chase(10, 4), a second decoding iteration is performed using Chase (8, 5) and a third decoding iteration is performed using Chase (6,3). Any other combination of decoding parameters may be used without departing from the teachings of the present disclosure.

In one embodiment, decoding parameters of the adaptive decoder (e.g., $L_i$, $S_i$,) may be determined based on the expected channel and/or expected amount of noise at different iterations. In one example, for the first few iterations of the TPC decoding, a code with higher correction capability may be used to be able to identify and correct as many errors as possible. After one or more iterations, the decoding parameters may be modified to a second set of decoding parameters. In general, decoding parameters of the adaptive decoder may be adjusted any number of times during the decoding process without departing from the teachings of the present disclosure.

It should be noted that in practice, finding decoding parameter settings for the decoder may be very expensive. For example, assuming that there are N Chase-(L,S) parameters known whose decoding complexity is tractable, then there are $N^{I_{max}}$ possible decoder settings that needs to be tried to find the preferred decoder setting in terms of minimum complexity with maximum correction capability. If values of N and maximum number of decoding iterations ($I_{max}$) are 20 and 10, respectively, $20^{10}$ possible decoder settings may need to be checked through simulations. However, this task could be almost impossible.

Certain embodiments, disclose a novel method for finding the preferred decoder parameters for different iterations of Chase(L,S) algorithm. In one embodiment, the preferred decoder ascribes the maximum correction capability with the minimum decoding complexity. In one embodiment, a dynamic-programming based solution is disclosed for optimizing the decoding parameters of the decoder. Typical values of number of iterations and number of sets of decoding parameters are considered to be 20 and 15 in our simulations. However, number of iterations and number of sets of decoding parameters may be considered to be any integer without departing from the teachings of the present disclosure. In one embodiment, these numbers can be selected based on the latency requirement of the system and/or other system requirements.

As described above, the problem of finding optimal parameters for Chase decoding for different iterations is quite challenging. In this optimization problem, challenges may be twofold. As an example, for storage applications, the first challenge lies in the strict requirement from product application requiring very low error floors (e.g., lower than $e^{-11}$ codeword failure rate). The second challenge is that the latency of the soft decoder should be low enough to meet the worst case latency as specified by the product application. In general, Chase decoding is a slow decoding algorithm, therefore, in one embodiment, latency of the decoding is also considered while determining decoding parameters. Certain embodiments disclose a method for finding preferred decoding parameter settings for different iterations of an adaptive Chase decoder by defining a metric that takes into account the correction capability of the decoding, complexity of the decoding procedure, and other decoding parameters. In one embodiment, summation of the proposed metric over all iterations can be maximized to find preferred parameters for different iterations.

In one embodiment a novel method is described using dynamic programming to determine decoder parameters. For example, a plurality of states are defined corresponding to number of tractable parameter sets for the decoder. In one embodiment, preferred parameter sets are selected through constructing a trellis using these states. At each state in trellis, the most favorable path is stored that provides the maximum correction capability with minimum Chase decoding complexity. In one embodiment, number of stages in trellis may be defined to be equal to the maximum number of decoding iterations. At the last stage of trellis, the state with the maximum value of the metric is selected and a trace back is used to find the preferred sets of decoding parameters for all iterations.

FIG. 1 is a flow diagram describing an example process of decoding a BCH codeword using a soft decision decoder. In this example, process 100 is implemented by a Chase(L, S) decoder, where L is the number of the least reliable bits, and S represents the maximum allowable bit flips in each flipped bit sequence. At 102, a first codeword corresponding to a plurality of information bits and a plurality of parity bits is received. Soft information (e.g., reliabilities) corresponding to each of the bits in the codeword are obtained. At 104, the set of reliabilities are used to identify the L locations of least reliable bits (LRBs) among the received bits. The parameter L can, in general, be selected to be any integer. In one embodiment, the choice of least reliable bit locations may be refined further using the information of syndromes of other component codewords that share these bits. At 106, all possible bit flip patterns of the L least reliable bits of the input set of hard decisions (e.g., the first codeword) are generated to form $2^L$ flipped bit sequences. For example, each bit sequence is generated by flipping one or more bits in the first codeword. In Chase (L,S), number of flipped bits in each of the flipped bit sequences is less than or equal to S.

At 108, each of the flipped bit sequences are decoded using a hard decision decoding algorithm (e.g., BCH hard decoder) to generate a set of candidate decoded bit sequences. The flipped set of bit sequences can be represented as $K=\{k^{(j)}, j=0, 1, \ldots, 2^L-1\}$. Each of the set of $2^L$ bit sequences is fed into a hard decision error correction decoder. The hard decision error correction decoder then attempts to decode each of the $2^L$ bit sequences. For each decoding attempt, there are two possibilities: if the hard decision decoder deems the input bit sequence uncorrectable, that particular decoding attempt is discarded. If the hard decision decoder deems the input bit sequence correctable, the decoder will propose one or more bit flips to the input bit sequence.

Assuming that the hard decision error correction decoder is a BCH decoder with t=3, then the decoder can propose up to t locations of the correctable input bit sequence that need to be flipped. Note that the locations of the bit flips indicated by the hard decision decoder can be anywhere in the codeword, not just in the L least reliable locations. Set $X=\{\hat{x}^{(j)}, j=0, 1, \ldots, l, \text{ where } l \leq 2^L\}$ represents the set of decoded bit sequences output by the hard decision decoder (e.g., which is in turn a part of the soft decision Chase decoder). Because not every bit sequence may be decodable, the number of decoded bit sequences l may be fewer than the total number of bit sequences, $2^L$. Furthermore, at least some of the decoded bit sequences of set X are not distinct since multiple bit sequences may be decoded to the same codeword. The decoded bit sequences of set X may be thought of as a list of "candidate codewords" or "candidate decoded bit sequences" from which one is to be selected and output by the Chase decoder.

At 110, a decoded bit sequence is selected from the set of candidate decoded bit sequences. The selected decoded bit sequence includes one or more proposed corrections corresponding to one or more of the received bits. If the decoded set X is empty, the codeword is uncorrectable. If X is not empty, one of the candidate codewords is selected from the set of candidate codewords to output from the Chase decoder as the decoded codeword. A metric is usually generated to compare different candidate decoded codewords and select one that is the most likely decoded codeword by comparing the candidate codewords to the received codeword.

In the Chase(L,S) decoding, the total number of BCH decoding procedures can be given as follows:

$$C_{chase(L,S)} = \sum_{k=0}^{S} \binom{L}{k}$$

Number of times that the BCH decoder is used in the Chase(L,S) method is much smaller than the number of times that the BCH decoder is used in the conventional Chase decoder. Chase(L,S) decoding algorithm limits the maximum allowable flips out of the L possible error locations to be equal to S. It should be noted that value of S may depend on parameters of the system and desired decoding performance of the soft decoder. For example, the value of S can be determined by considering the desired latency of the decoder. Increasing the value of S results in a better decoding performance at the cost of extra decoding latency. Also, increasing value of S gives diminishing returns after a certain point.

Certain embodiments determine decoding parameter settings for an adaptive Chase (L,S) decoder as follows. Let $P_i=(L_i, S_i)$ denote the Chase decoding parameter settings for $i^{th}$ iteration of the adaptive decoder where $(L_i, S_i)$ are parameters for Chase($L_i, S_i$) decoding. Let $c_i(P_i)$ denote the maximum number of BCH decoding attempts for Chase ($L_i$, $S_i$). Let $\#_i^f$ denote number of failed constituent codewords at the $i^{th}$ iteration. In one embodiment, a search for a preferred set of soft decoder parameters can be formulated as follows:

$$\hat{\bar{P}} = \text{argmax}_{\bar{P}=P_1^{I_{max}}} \sum_{i=1}^{I_{max}} E_i^c(P_{i-1}, P_i) / (\#_i^f c_i(P_i))$$

$$= \text{argmax}_{\bar{P}=P_1^{I_{max}}} \sum_{i=1}^{I_{max}} M_i(P_{i-1}, P_i)$$

where $E_i^c(P_{i-1}, P_i)$ is the number of errors corrected by changing the decoding settings from a decoder setting from a decoder setting $P_{i-1}$ to a decoder setting $P_i$. In addition, $\bar{P}$ represents estimated optimal soft decoder parameter settings for all the decoding iterations. As an example, $\bar{P}$ includes set of parameters $L_i$, $S_i$ for $i^{th}$ iteration, $i=1, \ldots, I_{max}$.

In one embodiment, the above problem can be reformulated to simplify the optimization problem, as follows:

$$\hat{\bar{P}} = \text{argmax}_{\bar{P}=P_1^{I_{max}}} \sum_{i=1}^{I_{max}} E_i^c(P_{i-1}, P_i),$$

$$w.r.t \text{ minimizing } C = \sum_{i=1}^{I_{max}} \#_i^f c_i(P_i)$$

where $M_i(P_{i-1}, P_i) = E_i^c(P_{i-1}, P_i)/(\#_i^f c_i(P_i))$. It should be noted that the metric $M_i(P_{i-1}, P_i)$ can also be selected in any other way, without departing from the teachings of the present disclosure. For example, any other conditions and/or parameters may be included in the optimization problem. It should be noted that the above example formulation assumes that error corrections at a decoder setting $P_i$ is only affected by the previous decoder setting $P_{i-1}$. This assumption simplifies the optimization problem. However, in general, the decoder setting Pi may be affected by any number of previous decoder settings and/or stages without departing from the teachings of the present disclosure.

In one embodiment, in order to determine decoder settings for the adaptive decoder as described above, a trellis with N states can be constructed. In one embodiment, each of the N states correspond to one of the soft decoder parameter sets. In one embodiment, number of stages in the trellis is considered to be equal to the maximum number of decoding iterations (e.g., $I_{max}$). However, any other number of stages may be considered for the trellis without departing from the teachings of the present disclosure.

Figure 2:
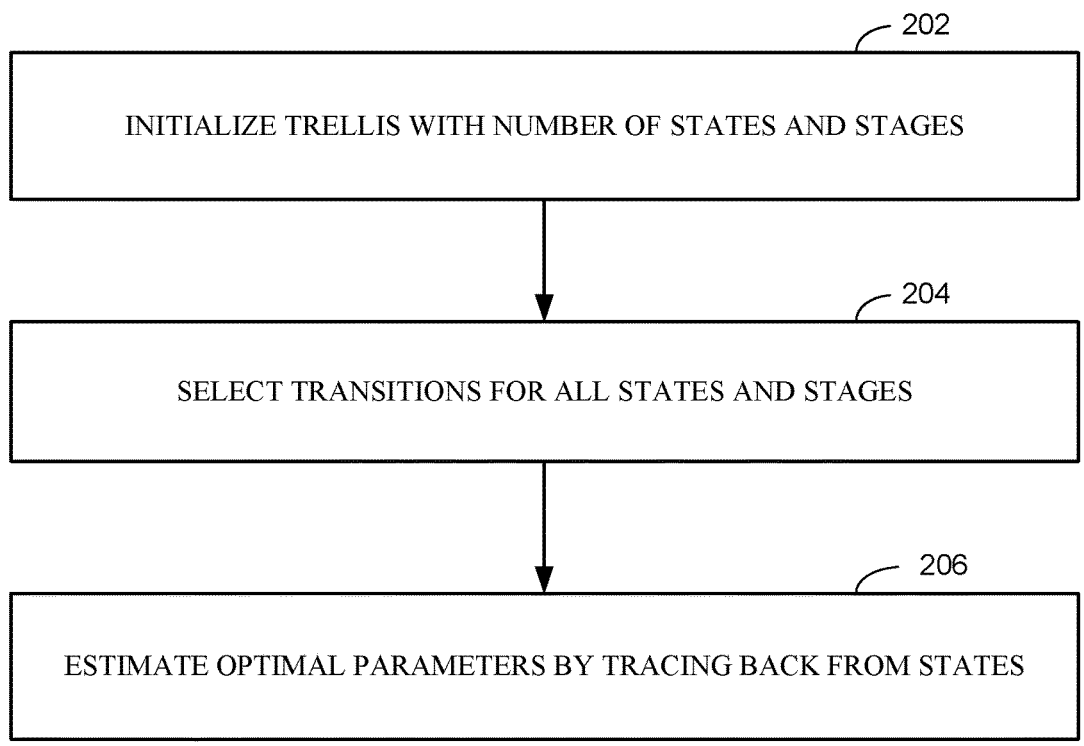
FIG. 2 illustrates a top level block diagram of the proposed method for determining soft decoding parameters of a system, in accordance with certain embodiments of the present disclosure.

FIG. 2 illustrates a top level block diagram of the proposed algorithm, in accordance with certain embodiments of the present disclosure. At 202, the trellis is initialized with N states and I stages. In one embodiment, each of the N states may correspond to one of the soft decoder settings whose decoding complexity is tractable. For example, the first state may correspond to one of the decoding settings that can be performed whose decoding latency is smaller than the required decoding latency in the system and decoding complexity is smaller than a predefined decoding complexity. In one embodiment, each of the decoding settings whose decoding complexity is tractable may be found in advance through simulations based on parameters of the system.

At 204, the transitions between the N states from state i to stage i+1 are determined based on one or more transition metrics. At 206, a set of preferred decoding parameter settings is determined by tracing back from the last stage to the first stage.

Figure 3:
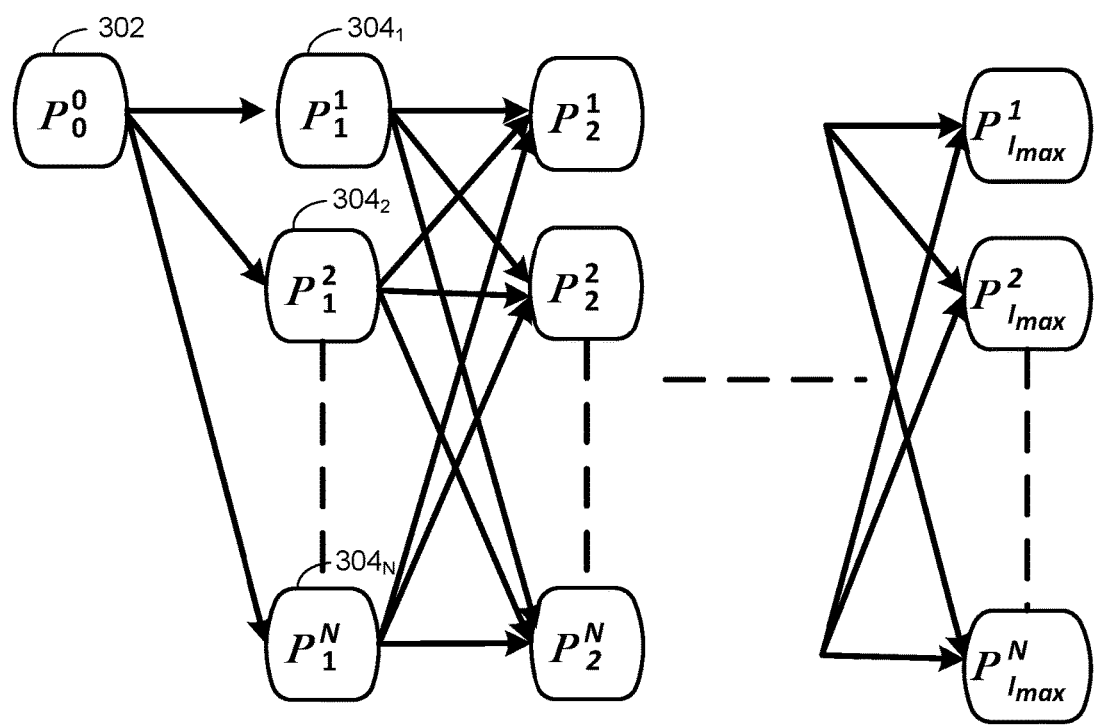
FIG. 3 illustrates an example trellis corresponding to the adaptive soft decoder, in accordance with certain embodiments of the present disclosure.

FIG. 3 illustrates an example trellis corresponding to parameters of the proposed adaptive decoder, in accordance with certain embodiments of the present disclosure. In this example, the trellis $N \times I_{max}+1$ states and $I_{max}+1$ stages. Each stage of the trellis has N states. Each state $P_i^j$ corresponds to $j^{th}$ state of the $i^{th}$ stage. As illustrated, state $P_0^0$ 302 is the initial state with no decoder setting. In each stage i, $i=1, \ldots, I_{max}$, N states are present. For example, states $P_1^1$ $304_1$, $P_1^2$ $304_2$, and $P_1^N$ $304_N$ correspond to stage 1 of the trellis shown in FIG. 3. Similarly, states $P_j^1$, $P_j^2, \ldots, P_j^N$ correspond to stage j of the trellis. Each state $P_i^j$, $j=1, \ldots,$ N, can transition to any one of the states in the next stage (stage i+1). Similarly, N transitions are possible to each state $P_i^j$. Each of the transitions are from one of the N states in stage i−1, to one of the N states in stage i. In one embodiment, a metric is calculated for each of the state transitions from one stage to the next stage.

Figure 4:
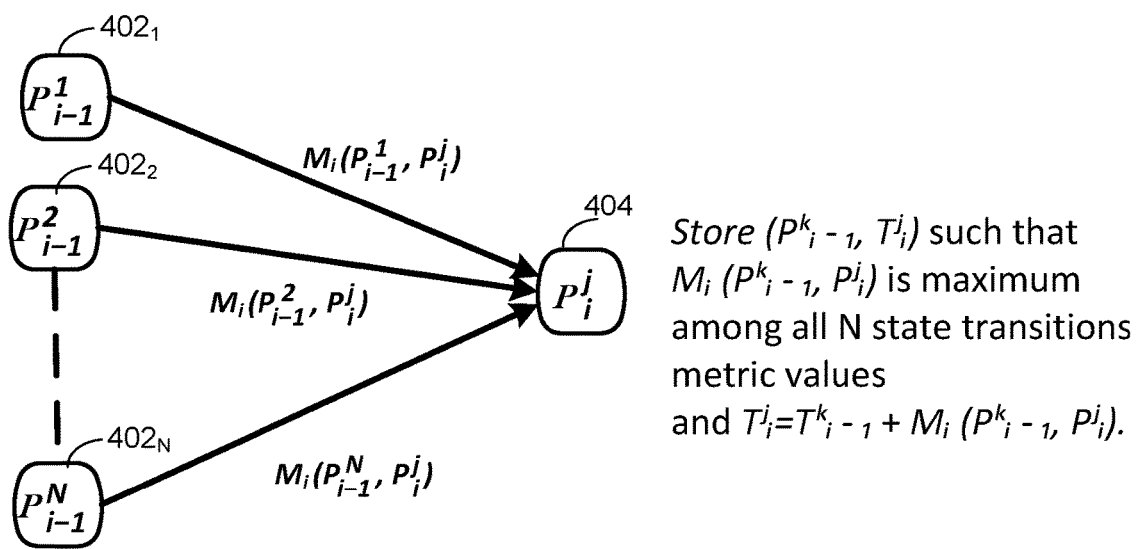
FIG. 4 illustrates an example state transition selection method in a trellis, in accordance with certain embodiments of the present disclosure.

FIG. 4 illustrates an example state transition selection method based on maximum metric values from state i−1 to state i, in accordance with certain embodiments of the present disclosure. As illustrated, each of the states $P_{i-1}^1$ 402$_1$, $P_{i-1}^2$ 402$_2$, and $P_{i-1}^N$ 402$_N$ may transition to state $P_i^j$ 404. For each transition, a path metric is determined. For example, for the transition from state $P_{i-1}^1$ to state $P_i^j$, path metric $M_i(P_{i-1}^1, P_i^j)$ is calculated. In one example, out of the N state transitions, the transition with maximum metric value is selected as a winner transition. The winner transition and its corresponding states may be stored along with an updated metric value. For each state $P_i^j$, values of $(P_{i-1}^k, T_i^j)$ are stored such that $M_i(P_{i-1}^1, P_i^j)$ is maximum among all N state transition metric values and $T_i^j = T_{i-1}^k + M_i(P_{i-1}^1, P_i^j)$.

In one embodiment, at the last stage, the $k^{th}$ state with maximum metric $T_{I_{max}}^k$ is selected among all N states and a trace back is performed to find the optimal parameter set $\bar{P}$. During the trace back procedure, all the stages of the trellis are traced back based on the stored optimal parameters of each state at each stage starting from $P_{I_{max}}^k$ state. By performing the trace back procedure on the states with maximum path metrics, settings of the Chase (L, S) decoder at each iteration is determined (e.g., preferred decoding parameter set $\bar{P}$).

In one embodiment, the set of decoding parameters as described above can be used to adjust decoding parameters in each iteration of the Chase decoder for decoding constituent codes of a product code. The proposed method finds preferred values for the adaptive soft decoder that provide maximum correction capability with minimum decoding complexity.

Figure 5:
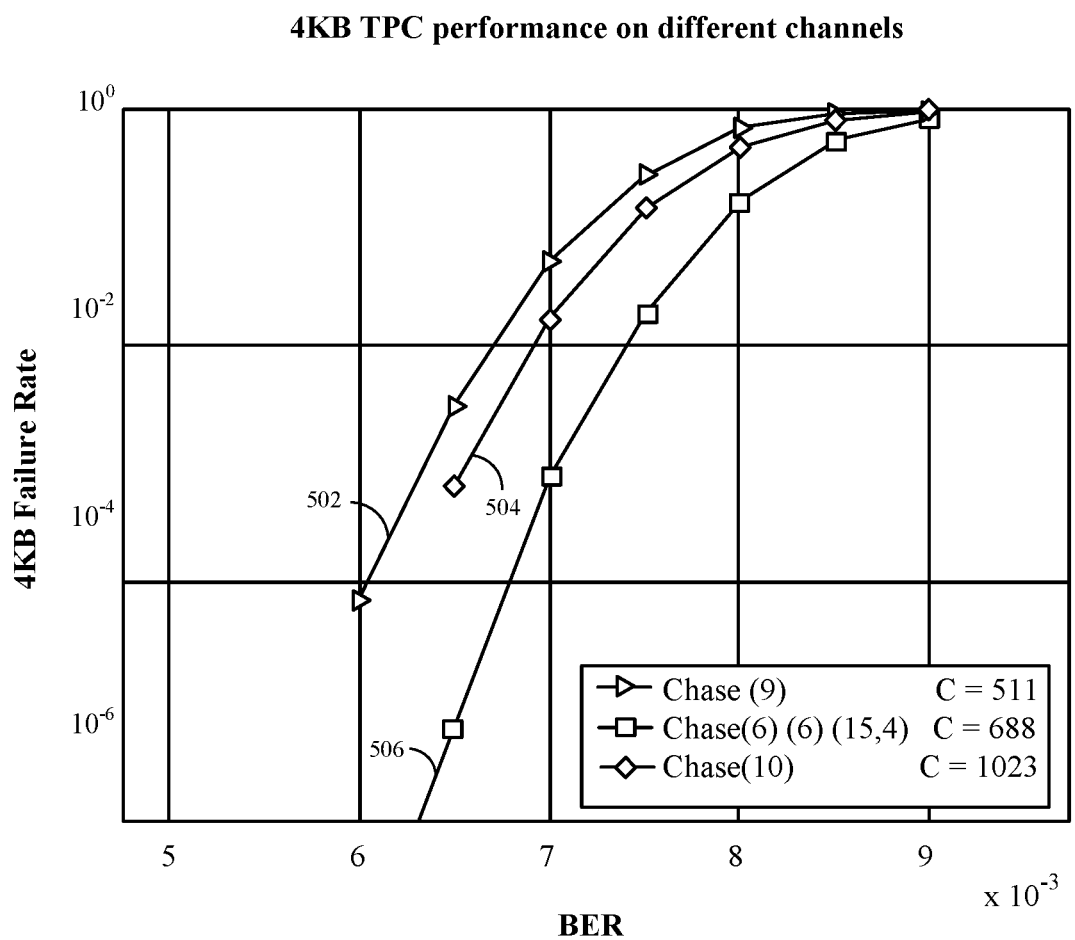
FIG. 5 illustrates performance of an example adaptive Chase (L,S) decoder, in accordance with certain embodiments of the present disclosure.

FIG. 5 illustrates performance of an example adaptive Chase (L,S) decoder, in accordance with certain embodiments of the present disclosure. In this figure, decoding parameters are selected for an additive white Gaussian channel (AWGN). However, the proposed ideas can be applied to any other channels. Curves 502 and 504 show performances of a Chase(9) decoder and a Chase(10) decoder. In each of these two cases, decoding parameters are kept constant for all iterations. In curve 506, decoding performance is shown where Chase(6,6) is used at first two iterations of the adaptive decoding and Chase(15,4) is used at third iteration of the adaptive decoding. The decoding is performed iteratively until the codeword is successfully decoded or the maximum allowable number of iterations is reached. In the example shown in FIG. 5, the simulation results are shown with 10 iterations. In one example, Chase (L, S) parameters can be adaptively adjusted as follows— (6,6), (6,6), (15,4), (6,6), (6,6), (15,4), (6,6), (6,6), (15,4), etc. As can be seen, complexity of the adaptive decoding procedure (e.g., curve 506) is smaller than a Chase(10) decoder but the performance gain is significant. In this example, the adaptive decoder breaks error patterns in which a few errors are present in the first 15 least reliable locations such that those errors are not present in the first ten least reliable locations.

Figure 6:
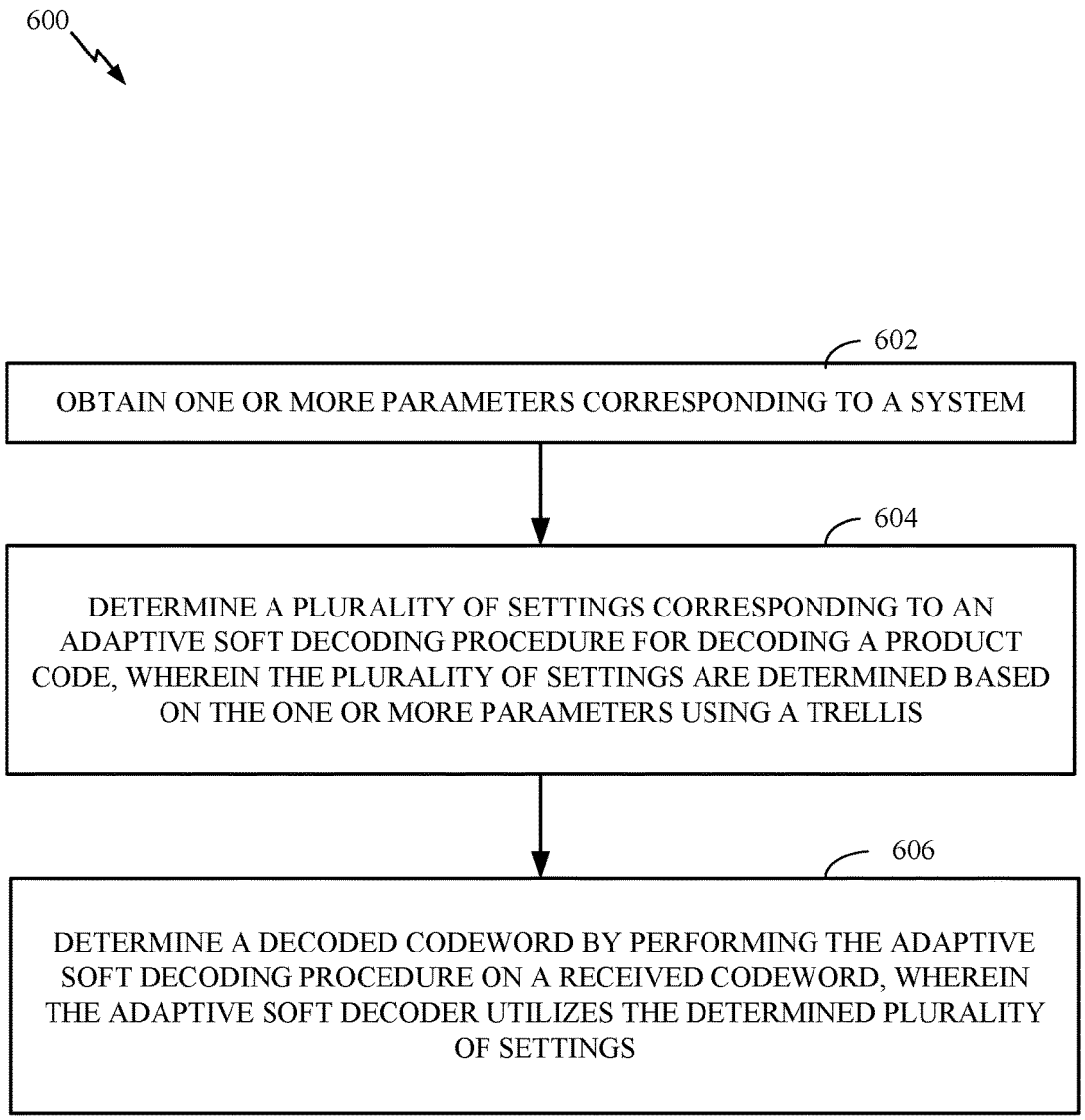
FIG. 6 illustrates example operations that may be performed by a device to decode a codeword, in accordance with certain embodiments of the present disclosure.

FIG. 6 illustrates example operations that may be performed by a device (e.g., a computing device) to decode a codeword, in accordance with certain embodiments of the present disclosure. At 602, the device obtains one or more parameters corresponding to a system. For example the one or more parameters may include desired decoding performance, latency requirements for the system, and any other parameters. At 604, the device determines a plurality of settings corresponding to an adaptive soft decoding procedure for decoding a product code. In one embodiment, the adaptive soft decoder is a Chase (L,S) decoder. In one embodiment, the plurality of settings are determined based on the one or more parameters using a trellis.

At 606, the device determines a decoded codeword by performing the adaptive soft decoding procedure on a received codeword. The adaptive soft decoder utilizes the determined plurality of settings to change the soft decoding parameters at each one or more iterations.

Figure 7:
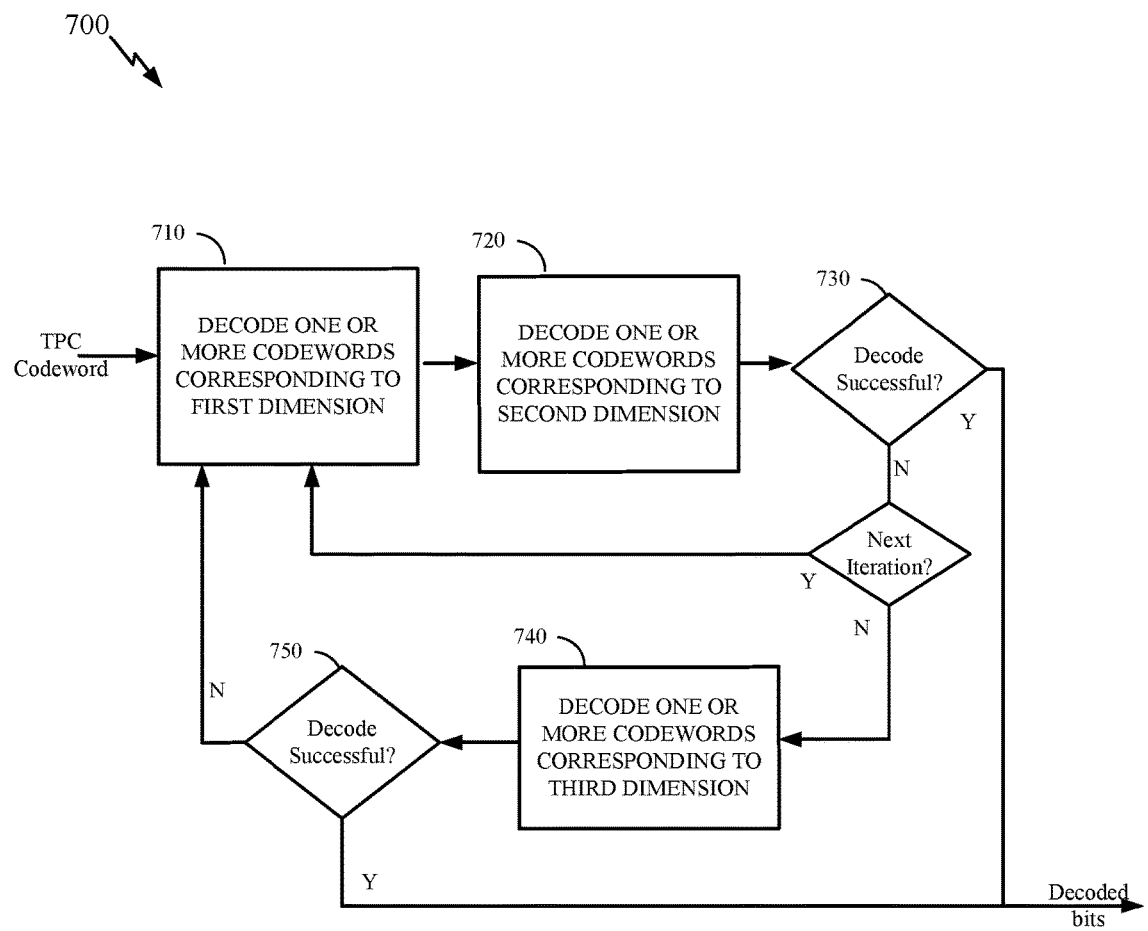
FIG. 7 illustrates an example three-dimensional TPC decoder, in accordance with certain embodiments of the present disclosure.
Figure 8:
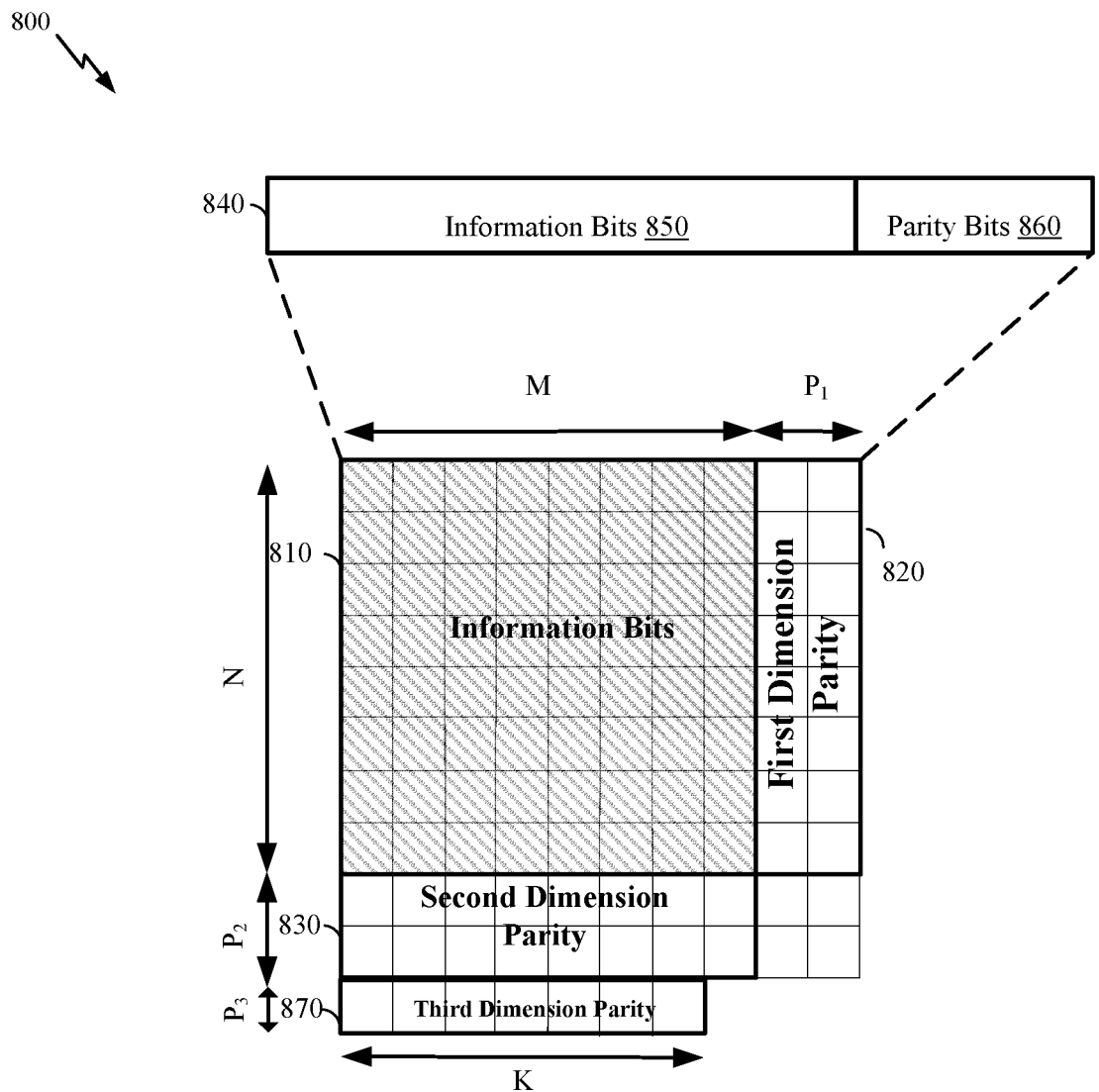
FIG. 8 illustrates an example block diagram of a TPC codeword, in accordance with certain embodiments of the present disclosure.

FIG. 7 illustrates an example multi-dimensional TPC decoder 700, in accordance with certain embodiments of the present disclosure. The TPC decoder may perform soft and/or hard decoding on one or more of the constituent codes in each dimension iteratively to generate a correct TPC codeword. In one embodiment, the TPC decoder may adaptively adjust decoding parameters of the soft decoder for each one or more iterations, as described herein. At 710, the TPC decoder decodes one or more codewords corresponding to a first dimension constituent code (e.g., a row codeword) in a received TPC codeword. As an example, for the TPC codeword as illustrated in FIG. 8, the decoder may decode one or more of the N row codewords. In one example, if each of the row constituent codewords is a BCH codeword, the TPC decoder performs BCH decoding (e.g., Chase (L,S) soft decoding, hard decoding, etc.) on each of the row codewords. In one embodiment, the TPC decoder performs an adaptive Chase(L,S) decoding procedure on the constituent codeword, whose decoding parameters are determined using the method proposed herein.

At 720, the decoder may decode one or more codewords corresponding to the second dimension constituent code. For example, the decoder may decode one or more of the M column codewords. In one example, if each of the column codewords is a BCH codeword, the TPC decoder performs BCH decoding on each of the column codewords. At 730, the decoder checks if decoding has been successful or not. If the decoding procedure has been successful, the TPC decoding stops and the decoder outputs the decoded bits. If the TPC decoding has not been successful (e.g., the decoder did not converge to a correct codeword), the TPC decoder may iteratively perform decoding on the first dimension and/or second dimension codewords to correct errors. Alternatively at 740, the TPC decoder may decode one or more codewords corresponding to the third dimension. At 750, the TPC decoder checks if the decoding has been successful or not. If yes, the decoded bits are output from the decoder. If the decoding process has not been successful, the TPC decoder may perform another round of decoding on the first, second and third dimensions of the decoder to find a correct codeword. If the decoder reaches a maximum number of iterations, the decoding process may stop even if a correct codeword is not found. In general, the TPC code may have any number of dimensions. In addition, the adaptive decoding procedure proposed herein may be performed on one the constituent codes in one or more dimension of the TPC code.

FIG. 8 illustrates an example three-dimensional TPC codeword, in accordance with certain embodiments of the present disclosure. As illustrated, the TPC codeword 800 may be a matrix of size $(N+P_2+P_3) \times (M+P_1)$, in which N represents number of rows of information bits, M represents number of columns of information bits, $P_1$ represents number of first dimension parity bits (e.g., row parity bits), $P_2$ represents number of second dimension parity bits (e.g., column parity bits), and $P_3$ represents number of third dimension parity bits. Information bits can be represented by a matrix of size N×M (e.g., matrix 810), first dimension parity bits can be represented by a matrix of size N×$P_1$ (e.g., matrix 820), second dimension parity bits may be represented by a matrix of size $P_2$×M (e.g., matrix 830), and third dimension parity bits may be represented by a matrix of size $P_3$×K (e.g., matrix 870). The TPC codeword may include N codewords corresponding to its first dimension (e.g., row codewords), M codewords corresponding to its second dimension (e.g., column codewords) and K codewords corresponding to its third dimension. Each row codeword 840 includes multiple information bits 850 and one or more parity bits 860. Similarly, each column codeword includes multiple information bits and one or more parity bits. As an example, if BCH codes are used as row constituent codes, the row codewords 1 through N are constructed using BCH encoding. Similarly, column codewords 1 through M, and third dimension codewords 1 through K are generated based on one or more error correcting codes (e.g., BCH code, Reed Solomon code, etc.).

It should be noted that although in the present disclosure turbo product codes and BCH codes are used as example embodiments, in general, the adaptive soft decoder can be applied to any code, without departing from the teachings of the present disclosure. In addition, the proposed method may be used to determine parameters of any adaptive decoder for any type of decoders, without departing from the teachings of the present disclosure.

Figure 9:
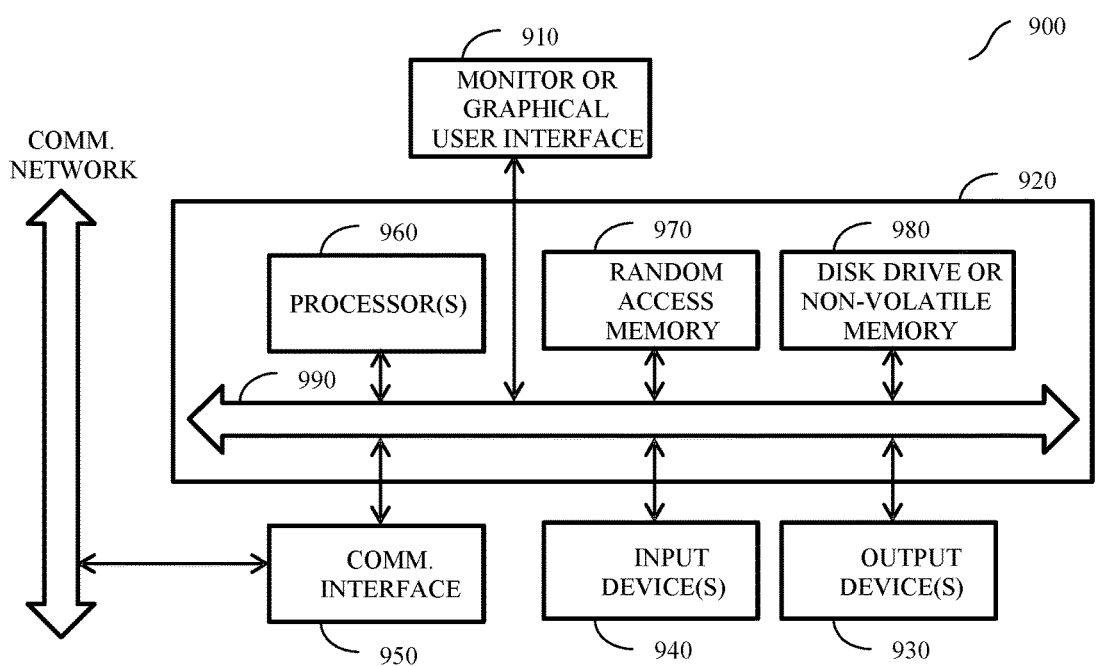
FIG. 9 describes one potential implementation of a device which may be used to decode a TPC codeword, according to one embodiment.

FIG. 9 describes one potential implementation of a device (e.g., a computing device) which may be used to decode a codeword, according to certain embodiments. FIG. 9 is merely illustrative of an embodiment incorporating the present invention and does not limit the scope of the invention as recited in the claims. One of ordinary skill in the art would recognize other variations, modifications, and alternatives. In one embodiment, computer system 900 typically includes a monitor 910, a computer 920, user output devices 930, user input devices 940, communications interface 950, and the like.

As shown in FIG. 9, computer 920 may include a processor(s) 960 that communicates with a number of peripheral devices via a bus subsystem 990. These peripheral devices may include user output devices 930, user input devices 940, communications interface 950, and a storage subsystem, such as random access memory (RAM) 970 and disk drive 980.

User input devices 930 include all possible types of devices and mechanisms for inputting information to computer system 920. These may include a keyboard, a keypad, a touch screen incorporated into the display, audio input devices such as voice recognition systems, microphones, and other types of input devices. In various embodiments, user input devices 930 are typically embodied as a computer mouse, a trackball, a track pad, a joystick, wireless remote, drawing tablet, voice command system, eye tracking system, and the like. User input devices 930 typically allow a user to select objects, icons, text and the like that appear on the monitor 910 via a command such as a click of a button or the like.

User output devices 940 include all possible types of devices and mechanisms for outputting information from computer 920. These may include a display (e.g., monitor 910), non-visual displays such as audio output devices, etc.

Communications interface 950 provides an interface to other communication networks and devices. Communications interface 950 may serve as an interface for receiving data from and transmitting data to other systems. Embodiments of communications interface 950 typically include an Ethernet card, a modem (telephone, satellite, cable, ISDN), (asynchronous) digital subscriber line (DSL) unit, FireWire interface, USB interface, and the like. For example, communications interface 950 may be coupled to a computer network, to a FireWire bus, or the like. In other embodiments, communications interfaces 950 may be physically integrated on the motherboard of computer 920, and may be a software program, such as soft DSL, or the like.

In various embodiments, computer system 900 may also include software that enables communications over a network such as the HTTP, TCP/IP, RTP/RTSP protocols, and the like. In alternative embodiments of the present invention, other communications software and transfer protocols may also be used, for example IPX, UDP or the like. In some embodiments, computer 920 includes one or more Xeon microprocessors from Intel as processor(s) 960. Further, one embodiment, computer 920 includes a UNIX-based operating system.

RAM 970 and disk drive 980 are examples of tangible media configured to store data such as embodiments of the present invention, including executable computer code, human readable code, or the like. Other types of tangible media include floppy disks, removable hard disks, optical storage media such as CD-ROMS, DVDs and bar codes, semiconductor memories such as flash memories, non-transitory read-only-memories (ROMS), battery-backed volatile memories, networked storage devices, and the like. RAM 970 and disk drive 980 may be configured to store the basic programming and data constructs that provide the functionality of the present invention.

Software code modules and instructions that provide the functionality of the present invention may be stored in RAM 970 and disk drive 980. These software modules may be executed by processor(s) 960. RAM 970 and disk drive 980 may also provide a repository for storing data used in accordance with the present invention.

RAM 970 and disk drive 980 may include a number of memories including a main random access memory (RAM) for storage of instructions and data during program execution and a read only memory (ROM) in which fixed non-transitory instructions are stored. RAM 970 and disk drive 980 may include a file storage subsystem providing persistent (non-volatile) storage for program and data files. RAM 970 and disk drive 980 may also include removable storage systems, such as removable flash memory.

Bus subsystem 990 provides a mechanism for letting the various components and subsystems of computer 920 communicate with each other as intended. Although bus subsystem 990 is shown schematically as a single bus, alternative embodiments of the bus subsystem may utilize multiple busses.

FIG. 9 is representative of a computer system capable of embodying the present invention. It will be readily apparent to one of ordinary skill in the art that many other hardware and software configurations are suitable for use with the present invention. For example, the computer may be a desktop, portable, rack-mounted or tablet configuration. Additionally, the computer may be a series of networked computers. Further, the use of other microprocessors are contemplated, such as Pentium™ or Itanium™ microprocessors; Opteron™ or AthlonXP™ microprocessors from Advanced Micro Devices, Inc; and the like. Further, other types of operating systems are contemplated, such as Windows®, WindowsXP®, WindowsNT®, or the like from Microsoft Corporation, Solaris from Sun Microsystems, LINUX, UNIX, and the like. In still other embodiments, the techniques described above may be implemented upon a chip or an auxiliary processing board.

Various embodiments of the present invention can be implemented in the form of logic in software or hardware or a combination of both. The logic may be stored in a computer readable or machine-readable non-transitory storage medium as a set of instructions adapted to direct a processor of a computer system to perform a set of steps disclosed in embodiments of the present invention. The logic may form part of a computer program product adapted to direct an information-processing device to perform a set of steps disclosed in embodiments of the present invention. Based on the disclosure and teachings provided herein, a person of ordinary skill in the art will appreciate other ways and/or methods to implement the present invention.

The data structures and code described herein may be partially or fully stored on a computer-readable storage medium and/or a hardware module and/or hardware apparatus. A computer-readable storage medium includes, but is not limited to, volatile memory, non-volatile memory, magnetic and optical storage devices such as disk drives, magnetic tape, CDs (compact discs), DVDs (digital versatile discs or digital video discs), or other media, now known or later developed, that are capable of storing code and/or data. Hardware modules or apparatuses described herein include, but are not limited to, application-specific integrated circuits (ASICs), field-programmable gate arrays (FPGAs), dedicated or shared processors, and/or other hardware modules or apparatuses now known or later developed.

The methods and processes described herein may be partially or fully embodied as code and/or data stored in a computer-readable storage medium or device, so that when a computer system reads and executes the code and/or data, the computer system performs the associated methods and processes. The methods and processes may also be partially or fully embodied in hardware modules or apparatuses, so that when the hardware modules or apparatuses are activated, they perform the associated methods and processes. The methods and processes disclosed herein may be embodied using a combination of code, data, and hardware modules or apparatuses.

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:

1. An apparatus for decoding, comprising:
a memory; and
at least one processor coupled to the memory, the at least one processor configured to:
obtain one or more parameters corresponding to a Chase (L,S) decoder;
determine a plurality of settings corresponding to decoding a product code by the Chase (L,S) decoder, wherein:
the plurality of settings are determined based on the one or more parameters using a trellis,
the plurality of settings comprise an "Li" setting and an "Si" setting for each decoding iteration "i" from a plurality of decoding iterations,
in the decoding iteration "i," the "Li" setting represents a maximum number of least reliable bits and the "Si" setting represents a maximum number of allowed bit flips in each flipped bit sequence,
the trellis comprises a number of stages and a number of states in each stage,
a stage corresponds to one of the plurality of decoding iterations, and
a state in the stage corresponds to a set of settings, the set comprising (i) a possible maximum number of least number of least reliable bits and (ii) a possible maximum number of allowed bit flips in each flipped bit sequence; and
determine a decoded codeword by performing an adaptive soft decoding procedure on a received codeword, wherein the adaptive soft decoding procedure uses the Chase (L,S) decoder with the plurality of settings.

2. The apparatus of claim 1, wherein determining the plurality of settings is based on path metrics associated with connections between the stages across the states, wherein each path metric is based on a number of failed constituent codewords.

3. The apparatus of claim 1, wherein the at least one processor is further configured to:
decode at least one of constituent codewords in the received codeword by:
performing the adaptive soft decoding procedure using a first set of decoder settings for a first set of decoding iterations to generate a first codeword, wherein the plurality of setting comprises a first set of decoder settings and a second set of decoder settings; and
performing the soft decoding procedure on the first codeword using the second set of decoder settings for a second set of decoding iterations to generate a second codeword, wherein at least one of the values in the first set of decoder settings is different from its corresponding value in the second set of decoder settings; and
update the at least one constituent codeword based on the second codeword.

4. The apparatus of claim 1, wherein at least one of the values in the first set of decoder settings is different from its corresponding value in the second set of decoder settings.

5. The apparatus of claim 4, wherein the at least one processor is further configured to:
generate a plurality of path metrics corresponding to a plurality of state transitions in the trellis; and
determine the plurality of settings corresponding to the adaptive soft decoding procedure by selecting the plurality of settings corresponding to a maximum path metric.

6. The apparatus of claim 1, wherein the at least one processor is further configured to:
determine a transition metric corresponding to transition from a first state in the trellis to a second state in the trellis based on the number of corrected errors by transitioning from the first state to the second state, wherein the first state corresponds to a first set of decoder settings and the second state corresponds to a second set of decoder settings.

7. The apparatus of claim 1, wherein the at least one processor is further configured to:
determine a transition metric corresponding to transition from a first state in the trellis to a second state in the trellis based on a number of failed constituent codewords at a soft decoding iteration corresponding to the second state, wherein the first state corresponds to a first set of decoder settings and the second state corresponds to a second set of decoder settings.

8. The apparatus of claim 1, wherein the product code comprises a turbo product code.

9. A method for decoding a product code, comprising:
obtaining, by a computing device, one or more parameters corresponding to a Chase (L,S) decoder;
determining, by the computing device, a plurality of settings corresponding to decoding a product code by the Chase (L, S) decoder, wherein:
the plurality of settings are determined based on the one or more parameters using a trellis,
the plurality of settings comprise an "Li" setting and an "Si" setting for each decoding iteration "i" from a plurality of decoding iterations,
in the decoding iteration "i," the "Li" setting represents a maximum number of least reliable bits and the "Si" setting represents a maximum number of allowed bit flips in each flipped bit sequence,
the trellis comprises a number of stages and a number of states in each stage,
a stage corresponds to one of the plurality of decoding iterations, and
a state in the stage corresponds to a set of settings, the set comprising (i) a possible maximum number of least number of least reliable bits and (ii) a possible maximum number of allowed bit flips in each flipped bit sequence; and
determining, by the computing device, a decoded codeword by performing an adaptive soft decoding procedure on a received codeword, wherein the adaptive soft decoding procedure uses the Chase (L,S) decoder with the plurality of settings.

10. The method of claim 9, wherein the product code comprises a generalized product code.

11. The method of claim 9, further comprising:
performing the adaptive soft decoding procedure using a first set of decoder settings for a first set of decoding iterations to generate a first codeword, wherein the plurality of setting comprises a first set of decoder settings and a second set of decoder settings;
performing the soft decoding procedure on the first codeword using the second set of decoder settings for a second set of decoding iterations to generate a second codeword, wherein at least one of the values in the first set of decoder settings is different from its corresponding value in the second set of decoder settings; and
updating at least one constituent codeword in the received codeword based on the second codeword.

12. The method of claim 9, wherein a first state of the trellis corresponds to a first set of decoder settings and a second state of the trellis corresponds to a second set of decoder settings, wherein at least one of the values in the first set of decoder settings is different from its corresponding value in the second set of decoder settings.

13. The method of claim 12, further comprising:
generating a plurality of path metrics corresponding to a plurality of state transitions in the trellis; and
determining the plurality of settings corresponding to the adaptive soft decoding procedure by selecting the plurality of settings corresponding to a maximum path metric.

14. The method of claim 9, further comprising:
determining a transition metric corresponding to transition from a first state in the trellis to a second state in the trellis based on the number of corrected errors by transitioning from the first state to the second state, wherein the first state corresponds to a first set of decoder settings and the second state corresponds to a second set of decoder settings.

15. The method of claim 9, further comprising:
determining a transition metric corresponding to transition from a first state in the trellis to a second state in the trellis based on a number of failed constituent codewords at a soft decoding iteration corresponding to the second state, wherein the first state corresponds to a first set of decoder settings and the second state corresponds to a second set of decoder settings.

16. A non-transitory computer-readable storage medium comprising instructions that, upon execution by a processor of a computing device, configure the computing device to perform operations comprising:
obtaining one or more parameters corresponding to a Chase (L,S) decoder;
determining a plurality of settings corresponding to decoding a product code by the Chase (L,S) decoder, wherein:
the plurality of settings are determined based on the one or more parameters using a trellis,
the plurality of settings comprise an "Li" setting and an "Si" setting for each decoding iteration "i" from a plurality of decoding iterations,
in the decoding iteration "i," the "Li" setting represents a maximum number of least reliable bits and the "Si" setting represents a maximum number of allowed bit flips in each flipped bit sequence,
the trellis comprises a number of stages and a number of states in each stage,
a stage corresponds to one of the plurality of decoding iterations, and
a state in the stage corresponds to a set of settings, the set comprising (i) a possible maximum number of least number of least reliable bits and (ii) a possible maximum number of allowed bit flips in each flipped bit sequence; and
determining a decoded codeword by performing an adaptive soft decoding procedure on a received codeword, wherein the adaptive soft decoding procedure uses the Chase (L,S) decoder with the plurality of settings.

17. The -transitory computer-readable storage medium of claim 16, wherein determining the plurality of settings is based on path metrics associated with connections between the stages across the states, wherein each path metric is based on a number of failed constituent codewords.

18. The -transitory computer-readable storage medium of claim 16, wherein the product code comprises at least one of a turbo product code or a generalized product code.

19. The -transitory computer-readable storage medium of claim 16, wherein a first state of the trellis corresponds to a first set of decoder settings and a second state of the trellis corresponds to a second set of decoder settings, wherein at least one of the values in the first set of decoder settings is different from its corresponding value in the second set of decoder settings.

20. The -transitory computer-readable storage medium of claim 19, wherein the operations further comprise:
generating a plurality of path metrics corresponding to a plurality of state transitions in the trellis; and
determining the plurality of settings corresponding to the adaptive soft decoding procedure by selecting the plurality of settings corresponding to a maximum path metric.

* * * * *